(12) United States Patent
Arens et al.

(10) Patent No.: US 9,924,594 B2
(45) Date of Patent: Mar. 20, 2018

(54) POWER SEMICONDUCTOR MODULE AND METHOD FOR PRODUCING A POWER SEMICONDUCTOR MODULE

(71) Applicant: Infineon Technologies AG, Neubiberg (DE)

(72) Inventors: Andre Arens, Ruethen (DE); Juergen Hoegerl, Regensburg (DE); Magdalena Hoier, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 432 days.

(21) Appl. No.: 14/499,915

(22) Filed: Sep. 29, 2014

(65) Prior Publication Data
US 2015/0092376 A1   Apr. 2, 2015

(30) Foreign Application Priority Data
Sep. 30, 2013   (DE) .......................... 10 2013 219 780

(51) Int. Cl.
*H05K 7/10* (2006.01)
*H05K 7/12* (2006.01)
(Continued)

(52) U.S. Cl.
CPC .............. *H05K 1/111* (2013.01); *H01L 21/56* (2013.01); *H01L 25/18* (2013.01); *H01L 25/50* (2013.01); *H05K 1/0256* (2013.01); *H05K 1/181* (2013.01); *H05K 3/28* (2013.01); *H05K 7/1432* (2013.01); *H01L 23/3121* (2013.01);
(Continued)

(58) Field of Classification Search
CPC . H01L 2224/48091; H01L 2924/13055; H01L 2924/181; H01L 2924/00; H01L 2924/00012; H01L 2924/00014; H01L 21/56; H01L 2224/48137; H01L 25/18;
(Continued)

(56) References Cited

U.S. PATENT DOCUMENTS

| 5,444,297 A | * | 8/1995 | Oshima | ............... H01L 23/5383 |
| | | | | 257/660 |
| 6,060,772 A | * | 5/2000 | Sugawara | ............. H01L 25/162 |
| | | | | 257/678 |

(Continued)

*Primary Examiner* — Yuriy Semenenko
(74) *Attorney, Agent, or Firm* — Murphy, Bilak & Homiller, PLLC (57) ABSTRACT

A printed circuit board (PCB) has a first, structured metalization arranged on its top side and at least one second metalization arranged below the first metalization in a vertical direction, parallel to the first metalization and insulated therefrom. Also on the PCB top side is a bare semiconductor chip having contact electrodes connected by bonding wires to corresponding contact pads of the first metalization on the PCB top side. A first portion of the contact electrodes and corresponding contact pads carry high voltage during operation. All high-voltage-carrying contact pads are conductively connected to the second metalization via plated-through holes. An insulation layer completely covers the chip and a delimited region of the PCB around the chip, and all high-voltage-carrying contact pads and the plated-through holes are completely covered by the insulation layer. A second portion of the contact electrodes and corresponding contact pads are under low voltages during operation.

8 Claims, 5 Drawing Sheets

(51) Int. Cl.
*H05K 1/11* (2006.01)
*H01L 21/56* (2006.01)
*H01L 25/18* (2006.01)
*H01L 25/00* (2006.01)
*H05K 1/18* (2006.01)
*H05K 1/02* (2006.01)
*H05K 3/28* (2006.01)
*H05K 7/14* (2006.01)
*H05K 1/14* (2006.01)
*H01L 23/31* (2006.01)

(52) U.S. Cl.
CPC ............. *H01L 2224/48091* (2013.01); *H01L 2224/48137* (2013.01); *H01L 2924/13055* (2013.01); *H01L 2924/181* (2013.01); *H05K 1/144* (2013.01); *H05K 3/284* (2013.01); *H05K 2201/0104* (2013.01); *H05K 2201/042* (2013.01); *H05K 2201/10303* (2013.01); *H05K 2201/10318* (2013.01)

(58) Field of Classification Search
CPC ...... H01L 25/50; H05K 1/0256; H05K 1/111; H05K 1/144
See application file for complete search history.

(56) References Cited

U.S. PATENT DOCUMENTS

| | | | |
|---|---|---|---|
| 6,359,331 B1* | 3/2002 | Rinehart | H01L 23/642 257/691 |
| 2005/0202593 A1* | 9/2005 | Chen | H01L 21/561 438/108 |
| 2009/0231810 A1* | 9/2009 | Liang | H01L 23/473 361/699 |
| 2010/0188059 A1* | 7/2010 | Takano | H01L 23/142 323/234 |
| 2013/0015495 A1* | 1/2013 | Hauenstein | H01L 25/071 257/140 |

* cited by examiner

POWER SEMICONDUCTOR MODULE AND METHOD FOR PRODUCING A POWER SEMICONDUCTOR MODULE

PRIORITY CLAIM

This application claims priority to German Patent Application No. 10 2013 219 780.2, filed on 30 Sep. 2013, the content of said German application incorporated herein by reference in its entirety.

TECHNICAL FIELD

The invention relates to the field of power semiconductor modules, their construction and manufacturing methods.

BACKGROUND

Modern power semiconductor modules comprise not only power electronic semiconductor components (in particular power semiconductor switches), but also integrated circuits (ICs) as important components. The latter are used e.g. for switching power semiconductor switches or for measuring currents or temperatures. In this context, the term "intelligent power semiconductor modules" ("intelligent power module", for short: IPM) is often employed. Such IPMs typically comprise, in addition to the power electronics, the required driver circuits (gate drivers) and the like. The operating voltages customary in power semiconductor modules can be in the range of from hundreds of volts to a few kilovolts. These high voltages are present directly at some external contacts (high-voltage contacts) of the ICs (e.g. of the gate drivers), for which reason these IC units require effective insulation. Depending on the application and standards associated therewith, it is thus necessary to maintain spacings between the high-voltage contacts of the ICs and current-carrying parts at low potential (so-called air clearances and creepage paths), such that sufficient insulation is ensured. Insulating a plurality of IC units supplied with high voltage from one another likewise requires specific spacings relative to one another. If a plurality of such ICs are arranged on a printed circuit board (printed circuit card), these lateral spacings of the units on the printed circuit board provide for a large area requirement. The endeavor to obtain ever more compact modules demands a reduction of the area of the printed circuit board.

One possibility for ensuring the required area of the printed circuit board with the insulation remaining the same (i.e. with the creepage path remaining the same) consists in replacing the conventional SMD (SMD=surface mounted device) IC packages by packages having a smaller pitch (pitch=spacing of connection legs) or a BGA (BGA=ball grid array).

However, this method requires an additional insulation layer with which these chip packages have to be coated, which results in an additional work step. Moreover, the production of an insulation layer below the ICs can be realized only with high outlay. The area gained by these methods on the printed circuit board in comparison with the initial situation is only minimal and is therefore at odds with the significantly greater outlay of the insulation requirements (additional insulation layer).

SUMMARY

A power semiconductor module is provided that has a reduced space requirement with the same functionality, and a corresponding production method.

One aspect of the invention relates to a power semiconductor module. In accordance with one example of the invention, the power semiconductor module comprises a printed circuit board having a first, structured metalization arranged on a top side of the printed circuit board and having at least one second metalization, which is arranged below the first metalization in a vertical direction, parallel to said first metalization and is insulated therefrom. Arranged on the top side of the printed circuit board there is at least one bare semiconductor chip having a plurality of contact electrodes, which are in turn connected by means of bonding wires to corresponding contact pads of the first metalization on the top side of the printed circuit board. A first portion of the contact electrodes and of the corresponding contact pads carry high voltage during operation. All high-voltage-carrying contact pads are conductively connected to the second metalization via plated-through holes. An insulation layer completely covers the chip and a delimited region of the printed circuit board around the chip, wherein all high-voltage-carrying contact pads and the plated-through holes are completely covered by the insulation layer. A second portion of the contact electrodes and of the corresponding contact pads are under low voltages during operation.

A second aspect of the invention relates to a method for producing a power semiconductor module. In accordance with one example of the invention, the method comprises providing a printed circuit board having a top side and an underside, wherein structured metalizations are arranged on the top side and underside, and providing at least one bare semiconductor chip arranged on the top side of the printed circuit board and having a plurality of contact electrodes, which are connected by means of bonding wires to corresponding contact pads of the structured metalization on the top side of the printed circuit board. A first portion of the contact electrodes and of the corresponding contact pads carry high voltage during operation, and all high-voltage-carrying contact pads are conductively connected via plated-through holes to the structured metalization on the underside in an inner layer. An insulation layer is applied such that it completely covers the chip and a delimited region of the printed circuit board around the chip, wherein all high-voltage-carrying contact pads and the plated-through holes are completely covered by the insulation layer.

Those skilled in the art will recognize additional features and advantages upon reading the following detailed description, and upon viewing the accompanying drawings.

BRIEF DESCRIPTION OF THE DRAWINGS

The invention is explained in greater detail below on the basis of examples illustrated in the drawings. The figures illustrated in the drawings are not necessarily true to scale, nor should they be understood as restrictive with regard to the invention. Rather, importance is attached to elucidating the principle underlying the invention. In the drawings, identical reference signs designate identical components or signals having an identical or similar meaning.

DETAILED DESCRIPTION

In the following detailed description, reference is made to the accompanying figures illustrating specific exemplary embodiments for elucidation purposes. It goes without saying that the features of the different exemplary embodiments described herein can be combined with one another, unless indicated otherwise.

Figure 1A:
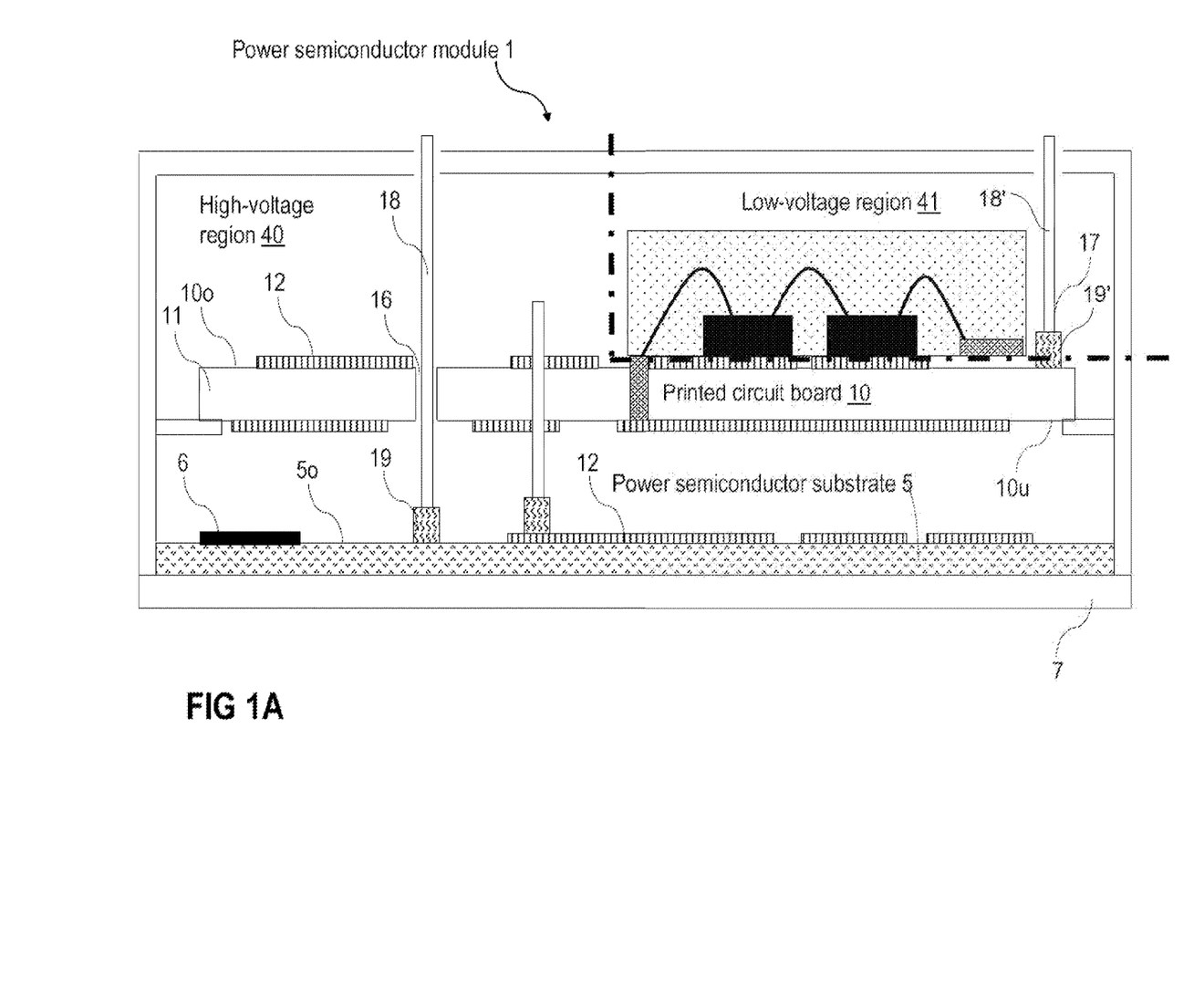
FIG. 1A shows, in a longitudinal sectional illustration, one exemplary embodiment of a power semiconductor module comprising a power semiconductor substrate and a control printed circuit board.

FIG. 1A shows a cross section through a power semiconductor module 1 in accordance with one example of the invention. The specific configuration of the control printed circuit board 10 makes it possible to integrate both the power electronics components and the control electronics into a compact package (e.g. an "EasyPACK® 2B" from Infineon), which hereto could only accommodate power electronics components (without a control printed circuit board). The printed circuit board 10 and the power semiconductor substrate 5 are arranged one above the other in the example illustrated in FIG. 1. In this case, the module 1 comprises the printed circuit board 10 with electronics components fitted thereon, which are explained further below with reference to subsequent figures, and also a power semiconductor substrate 5, which can be arranged on a heat sink 7. The power semiconductor substrate 5 has a structured metalization 12 at its top side 5o, wherein the top side is that side of the substrate which faces the printed circuit board 10. Various power semiconductor components 6 (e.g. IGBTs or diodes) can be arranged on the power semiconductor substrate 5.

The power semiconductor substrate 5 can be, in particular, a DCB substrate (DCB=direct copper bonded), a DAB substrate (DAB=direct aluminum bonded), or an AMB substrate (AMB=active metal braze), which have an insulating carrier composed of ceramic. A further power electronics substrate is the so-called IMS (IMS=insulated metal substrate), in which a metallic carrier is insulated from the metalization by a thin insulation layer. A metalization is arranged on both sides of the carrier (insulated metal or ceramic). The top-side metalization (top side 5o) is structured and therefore has conductor tracks, soldering pads and bonding pads and the like. The underside metalization (underside 5u) is usually over the whole area. In contrast to the power semiconductor substrate, the printed circuit board 10 does not comprise a ceramic carrier, but rather comprises a base material customary for printed circuit boards (PCBs), such as e.g. FR1 to FR5, wherein FR4 and FR5 (both glass-fiber-reinforced epoxy resin) are very often used.

Furthermore, contact pins 18 are fitted (e.g. by means of connection elements 19) on the top side 5o of the power semiconductor substrate 5, wherein, with the module package closed, contact is made with the electronics in the module by means of such contact pins. For this reason, the contact pins project from the top side of the package and serve as external load terminals ("power terminals") of the module 1. The contact pins 18 can be led through the printed circuit board 10, for which purpose corresponding holes are provided in the printed circuit board. If an electrically conductive contact between the contact pin 18 and the printed circuit board metalization is desired, the hole can be metallized and the contact pin 18 can be in electrical contact with said metalization in this case. The hole is then designated as contact hole 17. If a nonconductive feedthrough of the contact pin 18 through the printed circuit board 10 is required, the hole is configured such that it is insulating, rather than metalized. The hole is then designated as through hole 16. Besides the contact pins 18 fitted to the power semiconductor substrate 5, contact pins 18' can likewise be fitted on the printed circuit board 10 by means of connection elements 19', which contact pins can likewise project from the closed module. In this case, the contact pins can be configured such that they all project by the same distance outside the module. Two voltage regions thus exist in the module, a high-voltage region 40 and a low-voltage region 41. The voltage regions 40 and 41 are separated from one another—as indicated by a dash-dotted line in FIG. 1A. This separation becomes possible by virtue of an insulation layer 30, which will be described in detail later.

The advantage of the arrangement of the (driver) printed circuit board 10 in the manner illustrated in FIG. 1A is that the module package can be equipped very densely without external changes. It thus becomes possible to incorporate a control printed circuit board into a small module package which hitherto had space only for power semiconductor substrates (wherein the control printed circuit board was connected to the module externally). For the mechanical stabilization of the construction, a reinforcer plate can optionally also be inserted between power semiconductor substrate 5 and printed circuit board 10. The top side of the module package can be formed by a package cover, through which the contact pins are led. The cover can additionally have an opening, through which potting compound (e.g. a silicone gel) can be filled into the finished module in order to cover possibly exposed components on the power semiconductor substrate 5. The potting compound also serves to increase the insulation strength.

Figure 1B:
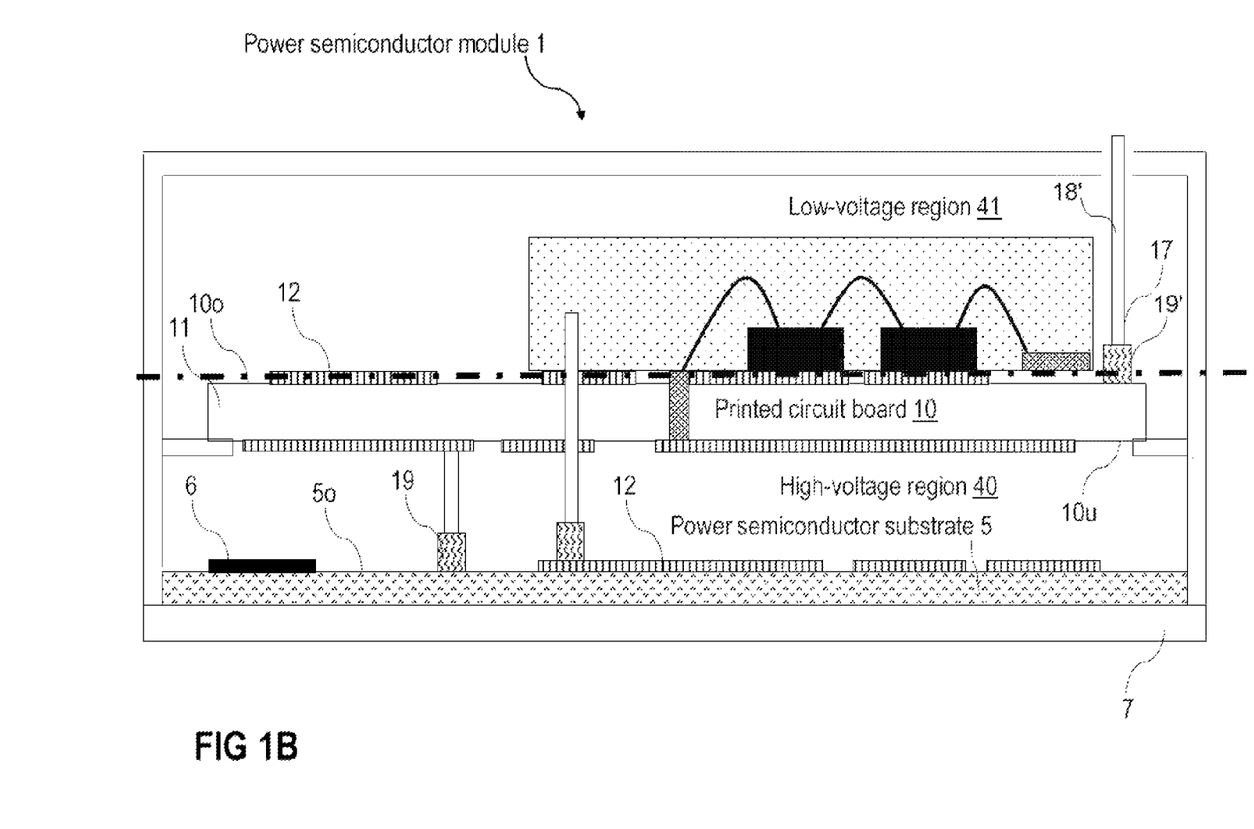
FIG. 1B shows, in a longitudinal sectional illustration, a further exemplary embodiment of a power semiconductor module comprising a power semiconductor substrate and a control printed circuit board.

FIG. 1B shows a cross section through a power semiconductor module 1 in accordance with a further exemplary embodiment of the invention, which is constructed analogously to that in FIG. 1A. The difference here, however, is that all high-voltage-carrying parts of the printed circuit board 10 are coated with the insulation layer, as a result of which there are no longer any exposed high-voltage-carrying parts on the top side 10o of the printed circuit board 10. As a result, the high-voltage region 40 is restricted to the underside 10u of the printed circuit board 10, as a result of which high- and low-voltage regions are separated or insulated from one another by the printed circuit board itself. Horizontal insulation clearances then need no longer be complied with on the top side of the printed circuit board.

Figure 2:
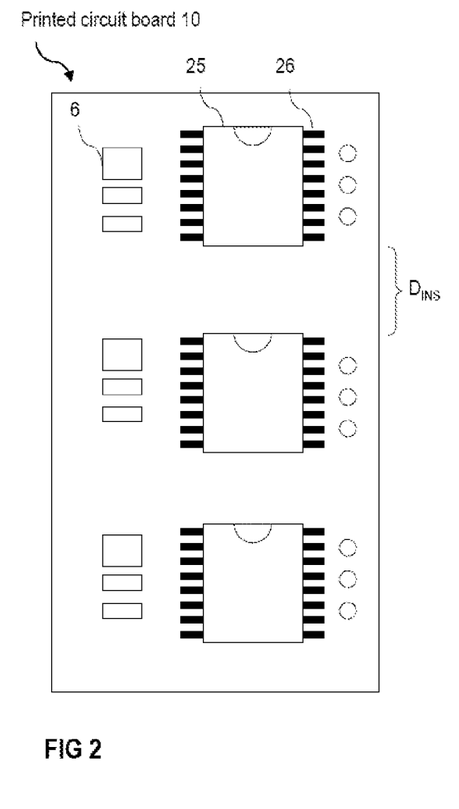
FIG. 2 shows one example of the control printed circuit board with a plurality of semiconductor chips arranged thereon using standard SMD technology with a package in a plan view.

Specific examples of the configuration of the printed circuit board are described in greater detail below. In this respect, FIG. 2 illustrates an exemplary embodiment of a known solution (in plan view) in which semiconductor chips 25 with package 25 are arranged on a printed circuit board 10 (PCB). In this case, the semiconductor chips 25 are arranged in a package (chip package), for example of the SOIC-16 type (SOIC denotes "small outline IC" and designates an SMD package form). The electrical connection contacts 26 (also called pins or terminals) of the chips project from the chip package and are soldered to the top-side metalization of the printed circuit board 10. High voltage is present at these contacts in part, for which reason an effective insulation is required. In the exemplary embodiment, the insulation is achieved by virtue of the ICs being arranged on the printed circuit board at a correspondingly sufficient lateral insulation distance $D_{INS}$ from one another. This lateral insulation distance avoids excessively high creepage currents. The required minimum distances and the package sizes of the chips 25 thus define for the printed circuit board 10 a minimum size which must be present in order to maintain the lateral insulation distances of the ICs. Furthermore, optional semiconductor components 6 (e.g. diodes) are illustrated schematically.

Figure 3:
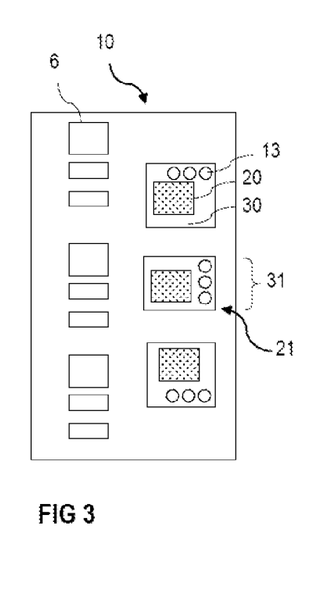
FIG. 3 illustrates the space saving in comparison with the example from FIG. 2, which is achieved by the use of a control printed circuit board with bare driver IC and additional insulation.

FIG. 3 shows a plan view of the top side 100 of the printed circuit board 10 in accordance with one example of the invention. In this case, the conventional chips with package 25 are replaced by bare chips 20 (also called "bare die"). The chips 20 have bonding pads 22, which are connected by means of bonding wires 14 to corresponding contact pads 23 on the structured metalization 11 on the top side of the printed circuit board 10. In addition, further optional semiconductor components can be arranged on the printed circuit board 10. The bare chips 20 have significantly smaller dimensions than the chip packages of the chips 25 from FIG. 1. However, the use of "bare dies" requires a different solution for ensuring the insulation.

Figure 4A:
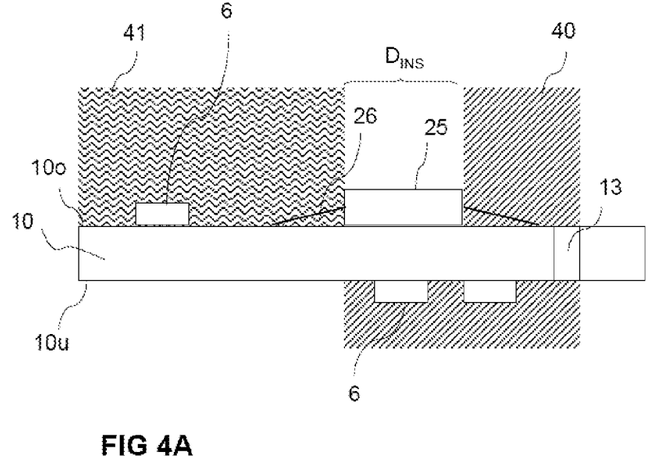
FIG. 4A shows a cross section through a part of the control printed circuit board with standard SMD drivers in accordance with FIG. 2 (horizontal insulation clearance)
Figure 4B:
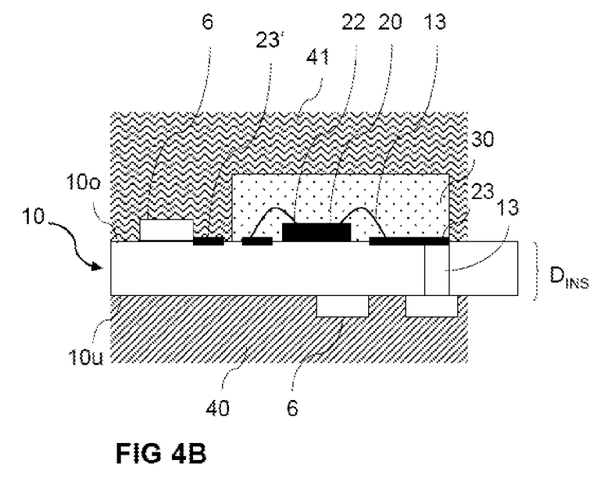
FIG. 4B shows a cross section through a part of the control printed circuit board in accordance with FIG. 3 (insulation in the vertical direction through the printed circuit board)

The required insulation is provided by an insulation layer 30, which completely encloses both the complete bare chip 20 and the contact-connection thereof comprising the contact electrodes 22, contact pads 23, bonding wires 14 and vias 13 (see FIG. 4B). The insulation layer 30 extends over a delimited region 31 around the bare chip 20 and is produced for example by means of a "dam and fill" method known per se. The totality of this insulation and the chip with the contact-connection thereof is designated as "insulated semiconductor chip" 21. The insulation layer 30 is practically an encapsulation of the chip and the contact-connection thereof. A "bare die" encapsulated in this way is significantly more compact than the packages (e.g. SOP or SSOP-Package) of the semiconductor chips in FIG. 1. As a result, it is possible to significantly reduce the size of the printed circuit board with insulation clearances between the encapsulated semiconductor chips 21 remaining the same, since the space-consuming chip packages are no longer necessary.

FIGS. 4A and 4B illustrate sectional views of the examples from FIG. 2 and FIG. 3, respectively. In this case, FIG. 4A shows the printed circuit board 10 having a top side 10o and an underside 10u, wherein the top side 100 and/or the underside 10u have/has a structured metalization 12. On the top side 10o there is applied at least one chip with package 25, the electrical contacts 26 of which are electrically conductively connected to the printed circuit board 10. Besides the chip with package 25, optional further semiconductor components 6 (e.g. diodes) can be applied on the top side 100. Optional semiconductor components 6 can likewise be applied on the underside 10u of the printed circuit board 10. The chip with package 25 on the top side 100 of the printed circuit board 10 can be electrically conductively connected to the underside 10u by means of a via 13. Since high voltage is present at a portion of the electrical contacts 26 of the chip with package 25 (on the right-hand side of the chip in the exemplary embodiment) and it is not insulated, a high-voltage region 40 arises and no contacts with low voltage are permitted to lie within said high-voltage region. Said high-voltage region 40 is illustrated in a hatched manner in FIG. 4A. The chip with package 25 is supplied with high voltage in this case from the underside 10u of the printed circuit board 10 through the via 13, for which reason the underside 10u is likewise part of the high-voltage region 40. Disposed in relation thereto is the low-voltage region 41, which is situated at the electrical contacts 6 with low voltage. Said low-voltage region 41 is illustrated with a wavy pattern in FIG. 4A. It is necessary for the two voltage regions to be effectively separated in order to avoid creepage currents or short circuits. The solution to this consists in a certain distance $D_{INS}$ (cf. FIG. 2) between the chips with package 25, which results in large printed circuit board sizes.

FIG. 4B shows a longitudinal section with respect to the plan view from FIG. 3, but with more details. FIG. 4B shows the printed circuit board 10 having a top side 10o and an underside 10u. Both the top side 10o and the underside 10u can have a structured metalization 12. At least one bare chip 20 is arranged on the top side 10o. The chip 20 has one or a plurality of bonding pads 22 electrically connected to corresponding contact pads 23, situated on the printed circuit board 10, by means of bonding wires 14. All high-voltage-carrying contact pads 23 are electrically connected to the structured metalization 12 of the underside 10u of the printed circuit board 10 by vias 13. In the case of multilayer printed circuit boards, the potential can also be passed to an intermediate layer instead of to the underside (cf. FIG. 5). Further semiconductor components 6 can be arranged both on the top side 10o and on the underside 10u of the printed circuit board 10. For the insulation of the "bare die" 20, an insulation layer 30 is applied to a delimited region 31 comprising the bare chip 20 and the contact-connection thereof (i.e. the contact electrodes 22, the contact pads 23, the bonding wires 14 and the vias 13 used). All high-voltage-carrying parts of the insulated chip 21 are thus encapsulated by the insulation layer.

The voltage regions as already mentioned in the case of FIG. 4A are now manifested differently. As a result of the insulation with the insulation layer 30, there are no exposed high-voltage-carrying parts located on the entire top side 10o of the printed circuit board 10, as a result of which the high-voltage region 40 is restricted to the underside 10u of the printed circuit board 10 (if appropriate, to an intermediate layer in the case of multilayer printed circuit boards). The entire top side 10o of the printed circuit board 10 can thus be assigned to the low-voltage region 41 since all high-voltage-carrying parts are encapsulated. The lateral insulation distance for separating the voltage regions which is required in the exemplary embodiment in FIG. 4A is therefore no longer necessary in the exemplary embodiment in FIG. 4B. Instead, the printed circuit board 10 itself forms the insulating or separating medium of the voltage regions, which overall permits a significantly more compact design.

Figure 5:
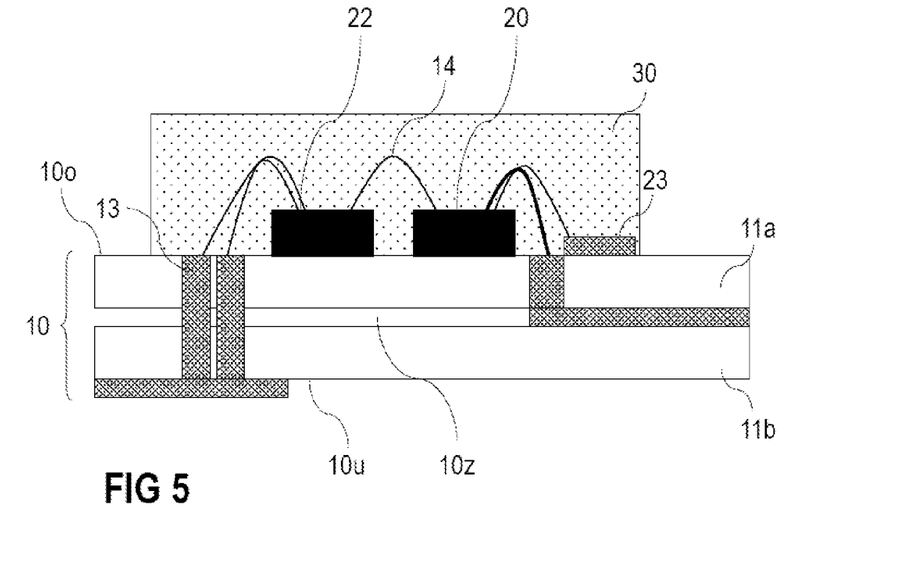
FIG. 5 shows one exemplary embodiment of a printed circuit board with a plurality of layers in a cross-sectional illustration.

Like FIG. 4B already, FIG. 5 shows the printed circuit board 10 in lateral cross section. In this exemplary embodiment, the printed circuit board comprises a so-called multilayer printed circuit board, which has three metalization layers in the present case. The printed circuit board 10 therefore has a first layer 11a composed of printed circuit board basic material (e.g. FR4) and a second layer 11b, which likewise consists of the printed circuit board basic material. The two layers 11a and 11b are connected by means of a (structured) metalization layer 10z. Three metalization layers (top side, inside, underside) are thus available in total. The printed circuit board 10 can also comprise more than three layers. The through contact from the top side 10*o* of the printed circuit board 10 to the underside 10*u* thereof or to an inner layer 10*z* is effected by vias 13, as in the previous exemplary embodiments. As also already in FIGS. 4A and 4B, the insulation layer encompasses the entire bare semiconductor chip 20 and the contact-connection thereof and the via(s) 13 used therefor, such that no high-voltage-carrying components without encapsulation are exposed on the top side 10*o* of the printed circuit board 10.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module, comprising:
   a printed circuit board having a first, structured metalization arranged on a top side of the printed circuit board and at least one second metalization, which is arranged below the first metalization in a vertical direction, parallel to the first metalization and insulated therefrom;
   at least one power semiconductor component;
   at least one bare semiconductor control chip configured to control the at least one power semiconductor component, the control chip arranged on the top side of the printed circuit board and having a plurality of contact electrodes, which are connected by bonding wires to corresponding contact pads of the first metalization on the top side of the printed circuit board, wherein a first portion of the contact electrodes and of the corresponding contact pads carry high voltage during operation, and wherein all high-voltage-carrying contact pads are conductively connected to the second metalization via plated-through holes; and
   an insulation layer which completely covers the control chip and a delimited region of the printed circuit board around the control chip,
   wherein all the high-voltage-carrying contact pads and the plated-through holes are completely covered by the insulation layer,
   wherein a second portion of the contact electrodes and of the corresponding contact pads are under low voltages during operation,
   wherein the at least one power semiconductor component is not covered by the insulation layer.

2. The power semiconductor module of claim 1, wherein the printed circuit board is fitted on a power semiconductor substrate with the at least one power semiconductor component arranged thereon, wherein the structured metalizations situated on an underside of the printed circuit board are electrically conductively connected to the power semiconductor substrate and/or the power semiconductor component.

3. The power semiconductor module of claim 1, wherein at least one further surface mounted device (SMD) component is arranged on the top side and/or underside of the printed circuit board.

4. The power semiconductor module of claim 3, wherein the at least one further SMD component and a delimited region of the printed circuit board around the at least one further SMD component are completely covered with the insulation layer.

5. A method for producing a power semiconductor module, the method comprising:
   providing a printed circuit board having a top side and an underside, wherein structured metalizations are arranged on the top side and underside;
   providing a power semiconductor component;
   providing at least one bare semiconductor control chip configured to control the power semiconductor component, the control chip arranged on the top side of the printed circuit board and having a plurality of contact electrodes, which are connected by bonding wires to corresponding contact pads of the structured metalization on the top side of the printed circuit board, wherein a first portion of the contact electrodes and of the corresponding contact pads carry high voltage during operation, and wherein all high-voltage-carrying contact pads are conductively connected via plated-through holes to the structured metalization on the underside or on inner layers of the printed circuit board;
   applying an insulation layer, which completely covers the control chip and a delimited region of the printed circuit board around the control chip,
   wherein all the high-voltage-carrying contact pads and the plated-through holes are completely covered by the insulation layer,
   wherein the power semiconductor component is not covered by the insulation layer.

6. The method of claim 5, further comprising:
   fitting the power semiconductor component on a power semiconductor substrate; and
   fitting the printed circuit board on the power semiconductor substrate,
   wherein the structured metalizations situated on the underside of the printed circuit board are electrically conductively connected to the power semiconductor substrate and/or the power semiconductor component.

7. The method of claim 5, further comprising:
   fitting at least one further semiconductor component on the top side and/or the underside of the printed circuit board.

8. The method of claim 7, further comprising:
   applying an insulation layer, which completely covers the at least one further semiconductor component and a delimited region of the printed circuit board around the at least one further semiconductor component.

* * * * *